(12) United States Patent
Fisher et al.

(10) Patent No.: US 7,545,640 B2
(45) Date of Patent: Jun. 9, 2009

(54) VARIOUS METHODS, APPARATUSES, AND SYSTEMS THAT USE IONIC WIND TO AFFECT HEAT TRANSFER

(75) Inventors: Timothy Scott Fisher, West Lafayette, IN (US); Suresh V. Garimella, West Lafayette, IN (US); David Batten Go, Lafayette, IN (US); Rajiv K. Mongia, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 290 days.

(21) Appl. No.: 11/676,194

(22) Filed: Feb. 16, 2007

(65) Prior Publication Data

US 2008/0197779 A1    Aug. 21, 2008

(51) Int. Cl.
*H05K 7/20* (2006.01)
*H01J 41/12* (2006.01)

(52) U.S. Cl. ............ 361/694; 361/690; 361/679.47; 29/592.1; 29/890.035; 417/49

(58) Field of Classification Search ............ 361/690, 361/694, 679.47; 29/592.1, 890.035; 417/49
See application file for complete search history.

(56) References Cited

U.S. PATENT DOCUMENTS

| | | | | |
|---|---|---|---|---|
| 3,361,337 A | * | 1/1968 | Hurst | 315/111.91 |
| 3,638,058 A | * | 1/1972 | Fritzius | 313/359.1 |
| 4,210,847 A | * | 7/1980 | Shannon et al. | 315/111.91 |
| 6,522,536 B2 | * | 2/2003 | Brewer et al. | 361/687 |
| 7,269,008 B2 | * | 9/2007 | Mongia et al. | 361/689 |
| 2006/0005946 A1 | * | 1/2006 | Borgstrom et al. | 165/96 |
| 2006/0061967 A1 | * | 3/2006 | Kim et al. | 361/704 |
| 2008/0060794 A1 | * | 3/2008 | Wei | 165/109.1 |
| 2008/0302510 A1 | * | 12/2008 | Ouyang | 165/80.3 |

FOREIGN PATENT DOCUMENTS

| | | | | |
|---|---|---|---|---|
| JP | 51148393 A | * | 12/1976 | |
| JP | 2001080908 A | * | 3/2001 | |

* cited by examiner

*Primary Examiner*—Anatoly Vortman
(74) *Attorney, Agent, or Firm*—Blakely, Sokoloff, Taylor & Zafman LLP (57) ABSTRACT

A method, apparatus, and system are described for an ionic wind generator. The ionic wind generator may have a first electrode that is elevated off a surface of a device that the ionic wind generator is intended to cool. A first surface of the first electrode is in contact with a first surface of a first post that elevates the first electrode off the surface of the device that the ionic wind generator is intended to cool. The ionic wind generator causes a generation of ions that are then drawn through an interstitial atmosphere from the first electrode to a second electrode to affect a velocity of local flow over the surface of the device between the first electrode and the second electrode. The flow from a forced flow device also affects the velocity of local flow over the surface of the device between the first electrode and the second electrode.

20 Claims, 7 Drawing Sheets

VARIOUS METHODS, APPARATUSES, AND SYSTEMS THAT USE IONIC WIND TO AFFECT HEAT TRANSFER

FIELD

Aspects of embodiments of the invention relate to the field of ionic wind engines; and more specifically, to the cooling of electronic components with one or more ionic wind engines.

BACKGROUND

For portable electronics, chip-integrated micro-cooling systems offer the greatest flexibility in designing the thermal management approach for the system. Additionally, air cooling is an attractive cooling option due to lower implementation costs. Cooling of integrated circuits is achieved by moving the heat away from the chip via a heat spreader and heat sink and then cooling the heat sink through forced convection. This method, however, may no longer be suitable as integrated circuits scale down with technology advances, and cooling requirements become more stringent. Also, increasing computing power and power density leads to an increased forced fluid flow demand, such as forced airflow from a fan, resulting in high acoustic noise levels.

BRIEF DESCRIPTION OF THE DRAWINGS

The drawings refer to embodiments of the invention in which:

FIG. 7 illustrates a block diagram of an example computer system that may use an embodiment of an ionic wind generator, While the invention is subject to various modifications and alternative forms, specific embodiments thereof have been shown by way of example in the drawings and will herein be described in detail The embodiments of the invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of electrodes, etc., in order to provide a thorough understanding of the embodiments of the invention. It will be apparent, however, to one of ordinary skill in the art that the embodiments of the invention may be practiced without these specific details. However, the specific numeric reference should not be interpreted as a literal sequential order but rather interpreted that the first driver is different than a second driver. Thus, the specific details set forth are merely exemplary. The specific details may be varied from and still be contemplated to be within the spirit and scope of the present invention.

In general, various methods, apparatuses, and systems are described for an example ionic wind generator. The ionic wind generator may take other forms of electrohydrodynamically driven cooling devices as will become readily apparent after reading the following text and drawings.

Figure 1:
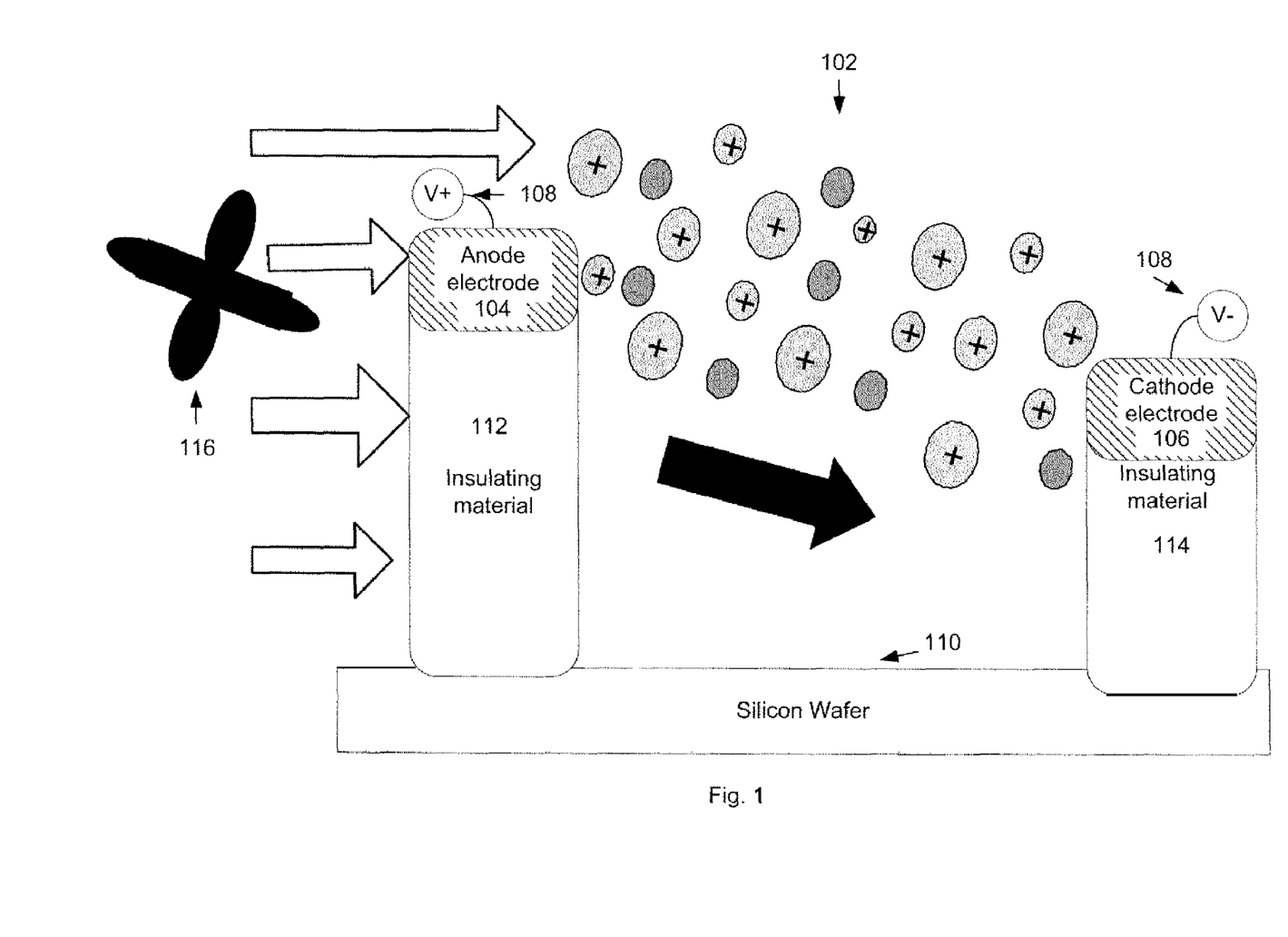
FIG. 1 illustrates a block diagram of an embodiment of an ionic wind engine with elevated electrodes.

FIG. 1 illustrates a block diagram of an embodiment of an ionic wind engine with elevated electrodes. The ionic wind generator 102 may have two or more electrodes, such as a first electrode 104 and a second electrode 106 a gap between the electrodes, a voltage source 108 to apply a voltage potential to the electrodes. The ionic wind generator 102 may have a first electrode 104 that is elevated off a surface of a device 110, such as a silicon wafer or skin of a memory device that the ionic wind generator 102 is intended to cool. A surface of the first electrode 104 is in contact with a surface of a first post 112, potentially made of insulating material. The post elevates the first electrode 104 off the surface of the device that the ionic wind generator 102 is intended to cool. A second electrode 106 of the ionic wind generator 102 may also be elevated off the surface of device that the ionic wind generator 102 is intended to cool via a second post 114 or other mechanism. The ionic wind generator 102 causes a generation of ions that are then drawn through an interstitial atmosphere, such as air, from the first electrode 104 to the second electrode 106 or vice versa to affect a velocity of local flow over the surface of the device between the first electrode 104 and the second electrode 106. A flow device 116, such as a fan, generates a bulk flow across the plate/electrodes. The ionic wind augments the flow from the forced flow device 116 affecting the velocity of local flow over the surface of the device 110 between the first electrode 104 and the second electrode 106.

The voltage source 108 applies a voltage potential between the two electrodes 104, 106 at atmospheric conditions. Through electron field emission, energetic electrons tunnel from the surface of the cathode electrode 106 into the atmosphere (termed field emission) due to the electric field and are accelerated by the electric field. The electrons collide with neutral interstitial molecules and, at sufficient kinetic energies, strip an electron from the neutral molecule to form an ion. Depending on the spacing between electrodes and the presence of nanostructures, naturally occurring, free electrons in the interstitial atmosphere may instead be accelerated by the electric field, collide with neutral molecules, and generate ions to form a corona discharge. In both phenomena, the voltage potential difference pulls the electrons towards the anode and the ions towards the cathode electrode 106. The electrons and positively charged ions are pulled in opposite directions by the electric field and continue to collide with neutral molecules. The ions exchange momentum with the neutral molecules accelerating the neutral molecules. The continued collision/momentum exchange effect causes a secondary, ionic wind to form, thus distorting the bulk flow from solely the flow device 116.

Thus, ionic winds, in general, are generated when molecular ions (typically positive) are drawn through the interstitial atmosphere by an applied electric field. The positive ions collide with neutral molecules, exchanging momentum, and causing the neutral molecules to move. The continued effect of momentum exchange, called ion drag, pumps stagnant fluid to form a wind. In the presence of a bulk airflow from the external forced flow source 116, an ionic wind can modulate the boundary layer resulting in increased local heat transfer. These micro scale ionic winds can be used for electronic component cooling and in particular local hot spot cooling.

However, one challenge in the operation of a micro scale ionic wind engine is the gathering or neutralization of ions on the surface between the electrodes 104, 106. Ions that are neutralized do not participate in distorting the bulk flow, thus diminishing any potential heat transfer enhancement and reducing the affect of the ionic wind. The neutralization of ions in the solid region between adjacent electrodes located on a surface can adversely affect the strength of the ionic wind generated and its potential heat transfer benefits.

By elevating the electrodes 104, 106 above the surface 110 in 'bridge-post' structures 112, 114, surfaces near the electrodes 104, 106 are eliminated and ion neutralization is mitigated. Accordingly, each micro scale ionic wind generator 102 may raise one or more of its electrodes 104, 106 above the primary surface 110 with a post structure 112, 114. Each post 112, 114 may be made of an insulating material or another material and may be of varied sizes and shapes. Each electrode is generally in contact with the post that elevates that electrode off the surface of device. The elevated electrodes above the surface eliminate or reduce the effect of ion gathering on the surface. The elevated electrodes above the surface eliminate or reduce the effect of the surface on ion generation and transport. Therefore, the ions will not be gathered or neutralized on the wafer surface and the ion concentration will not be diminished. Thus, most if not all of the ions generated will participate in the ionic wind; thereby, increasing the amount of heat transfer enhancement produced.

Further, the number of electrodes, relative height to each other, and their geometric orientation may be arranged in a specific geometry to shape local flow.

Figure 2:
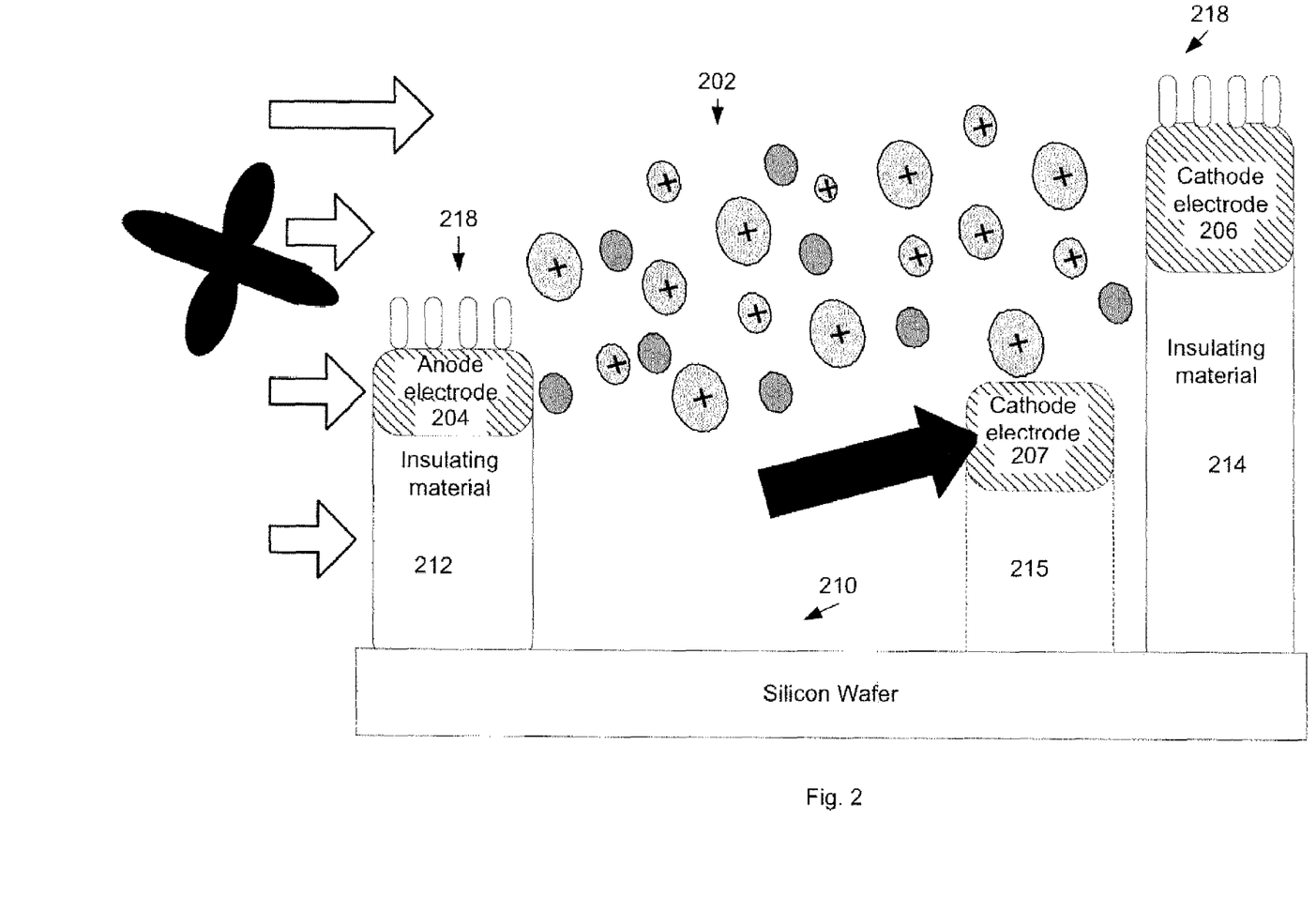
FIG. 2 illustrates a block diagram of an embodiment of an ionic wind engine configured with a number of electrodes, that have a relative height to each other, and a geometric orientation to each other to shape local air flow.

FIG. 2 illustrates a block diagram of an embodiment of an ionic wind generator configured with a number of electrodes that have a relative height to each other, and a geometric orientation to each other to shape local air flow. The first electrode 204 may act as an anode. The second and third electrodes 206, 207 may act as cathodes. The third and the second electrodes 206, 207 are placed relative to the surface of the device 210, each other, and the first electrode 204 to shape a velocity flow over the surface of the device. See, for example, FIGS. 4a and 4b. The second and third electrodes 206, 207 are both on posts 214, 215 that place them physically higher than the anode electrode 204. Optically, the third electrode 207 is just further back in the 2-D view.

The different height levels of the electrodes direct ionic flow and accordingly local flow either towards or away from the surface. For example, if the cathode electrode is closer to the surface than the anode electrode, the local flow will be directed toward the surface. If the cathode electrode is higher than the anode electrode, then the stream will be directed away from the surface. Note, one or more of the electrodes may be above the surface while the other electrodes are mounted directly at the surface. The elevation of at least one or more of the electrodes is advantageous in that it prevents neutralization of the ions that are generated as well as giving an additional degree of freedom in the design.

The number of electrodes in an ionic wind generator 202 and the relative geographic orientation to each other also affects the local airflow across the surface.

The applied voltage potential affects the shape of the ion cloud, which follows the shape of the generated electric field. The ion current concentrates on the front half of the cathode electrodes 206, 207, where the electric field is strongest. The molecules around the anode electrode 204 are charged by the electric field at the tip of the electrode. This generates a stream of ions between the anode electrode 204 and the cathode electrodes 206, 207. This generates a flow between the electrodes 204, 206, 207. The first and second electrodes 204, 206 have multiple nanostructures 218, formed through deposition or grown, forming one or more tips on a top surface of the electrodes to concentrate/amplify a strength of an electric field generated by that electrode. Concentrating the strength of the electric field reduces the voltage level required to cause the generation of ions drawn through the air between the first second and third electrodes 204, 206, 207. Each nano-structure can consist of, but is not limited to, carbon nanotubes, nano crystalline diamonds, nano filaments, nano-tips, nano spheres, or nano cylinders, or any combination thereof.

In an embodiment, the electrodes are of ~10 um in size with separation distances of ~10 um, which requires 100V in order to generate the ionic wind; however, other dimensions are possible. Further, as discussed the addition of the nanostructures may significantly lower a voltage level required to cause the generation of ions. A maximum applied voltage exists as well where Joule heating of the air occurs to reduce the heat transfer or even sparking between electrodes may occur.

Also, because electrohydrodynamic propulsion uses no moving parts, the ionic wind generator operation contributes virtually no acoustic noise to system's environment. The ionic wind generators locally improve the efficiency of the heat transfer process and may be strategically placed on all kinds of devices to achieve improved system level heat transfer efficiency.

Figure 3:
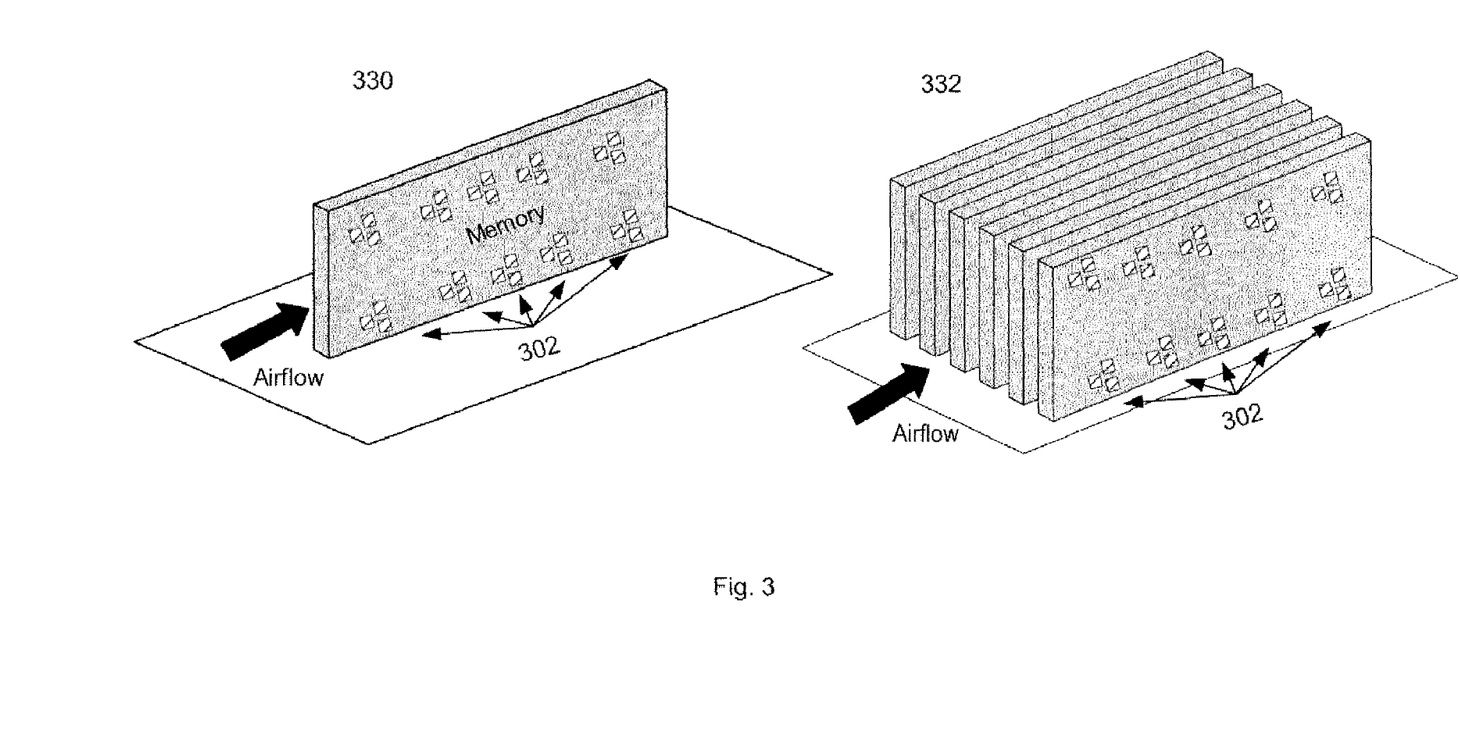
FIG. 3 illustrates an embodiment of memory devices having multiple ionic wind generators each having two corresponding elevated cathode electrodes for a single anode electrode to locally improve the efficiency of the heat transfer process as well as to improve system level heat transfer efficiency.

FIG. 3 illustrates an embodiment of memory devices having multiple ionic wind generators each having two corresponding elevated cathode electrodes to locally improve the efficiency of the heat transfer process as well as improved system level heat transfer efficiency. The surface of the memory device in a single card 330 or a rack of cards 332 may have multiple ionic wind generators 302 each having elevated electrodes to shape the velocity of the local flow across the surface of the device. Heat is transferred from the heated surface of the device to the fluid and then carried away by the forced bulk flow with the augmented ionic wind. Note, the heated surface can be the electronic component itself being cooled, or an extension of that surface using heat spreader technologies to make the heat transfer to the fluid more efficient. The ionic wind generators may be on either to cool the intended electronic component.

Figure 4:
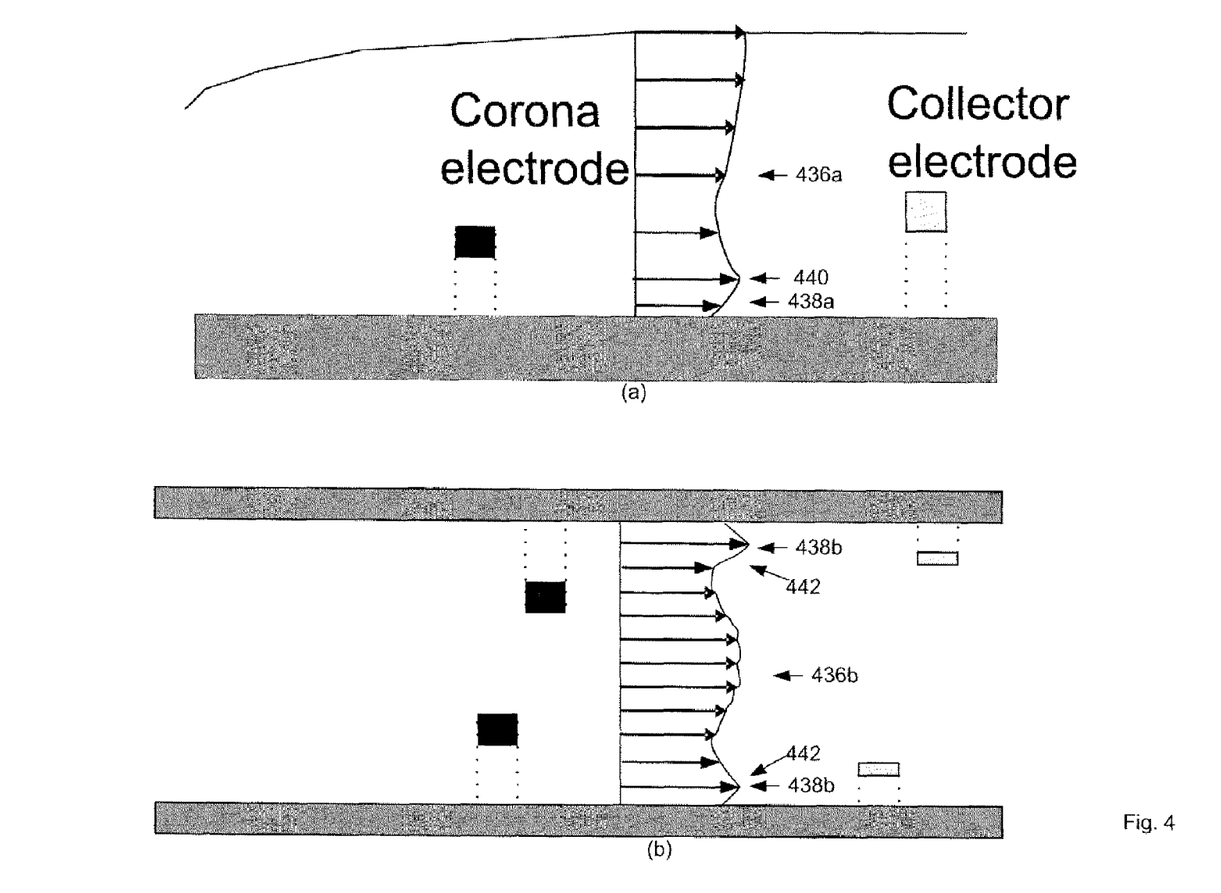
FIGS. 4a and 4b illustrate examples of a velocity profiles using ionic wind generators to create a local stream-wise jet near the surface of device.

FIGS. 4a and 4b illustrate examples of a velocity profiles using ionic wind generators to create a local stream wise jet near the surface of device. The ionic wind generators, which may be field-emitted electrons or corona discharge devices, may be placed in the bulk flow direction and elevated from a surface in order to generate a stream wise flow jet parallel to the surface that increases the local flow in the boundary layer 438a, 438b using an ionic wind. In the presence of a bulk flow, ionic winds distort the boundary layer 438a, 438b, to increase heat transfer from the wall. Without ionic wind generators, the flow at the flat wall or between the heat sink fins generates a boundary layer, where velocity is zero at the surfaces and increases to the mean stream velocity outside the layer as partially shown in FIG. 4a for a single flat wall or the middle layer in between two closely located parallel surfaces as partially shown in FIG. 4b. The ionic wind generators affect the local flow 436a, 436b to shape the resultant velocity profiles as shown.

The ion wind engine with the elevated electrodes is a passive cooling solution that improves the velocity gradient by perturbing the boundary label with a minimum increased pressure drop to impact the flow negatively. The velocity flow of the fluid 438a, 438b near the surface of the wall is increased with the ionic wind engines. The ion wind engine manipulates the bulk flow in discrete local areas creating enhanced micro flows bringing cool fluid toward a surface and removing hot fluid from a surface. The ion wind engine manipulates the flow of cooling fluid especially at boundary layers 438a, 438b perturbing, and disrupting, the flow and enhancing the heat transfer from an object to be cooled to the cooling fluid. The ionic wind generator intensifies flow near the wall 438a, 438b and imparts momentum to the fluid flow to at least partially compensate for friction losses in the fluid flow across the surface including maintaining a consistent fluid profile along the length of a surface such as a cooling fin. The ion current/wind may be aligned with the flow or in a different geometry to shape the overall flow between the electrodes.

As discussed, a height of the corona electrode (i.e. ion generator) electrode relative to the surface may be significantly different than a height of collector electrode (i.e. ion collector) relative to the surface in order to direct local flow either toward or away from the surface. Referring to FIG. 4a, in this case, the corona electrode is on top of a first post having a first height dimension from the surface and the collector electrode is on top of a second post having a second height dimension from the surface where the collector electrode is higher than the corona electrode. As such, the velocity gradient of the local flow over the surface of the device bulges 440 and increases further from the surface when the collector electrode is higher than the corona electrode.

Referring to FIG. 4b, in this case, the corona electrode is on top of a first post and the collector electrode is on top of a second where the corona electrode is higher than the collector electrode. As such, the velocity gradient of the local flow over the surface of the device sharpens 442 and increases closer to the surface when the corona electrode is higher than the collector electrode.

Testing has shown that experimentally a 2× improvement in heat transfer is achievable. Furthermore, unlike other heat transfer enhancement techniques, the pressure drop is not increased—in contrast; this technology will reduce the overall pressure drop of the system. Note that it does not replace the fan that delivers the global bulk flow. However, because of the higher velocity gradient near the surface, the heat transfer coefficient has improved significantly.

The ion wind engine with the elevated electrodes creates better cooling of air-cooled components in a notebook computer or other hand held devices. Elevating the ion generating electrodes above the surface does both more effective ion generation and transport, as well as prevents ion neutralization. Doing this will boost power levels of these components and will allow for higher performance. This is a "no moving parts" device that will increase heat transfer without increasing noise of a system. Furthermore, the ionic wind generators can be made very thin—making it easy to fit within the tight confines of a notebook or other hand held device.

Figure 5:
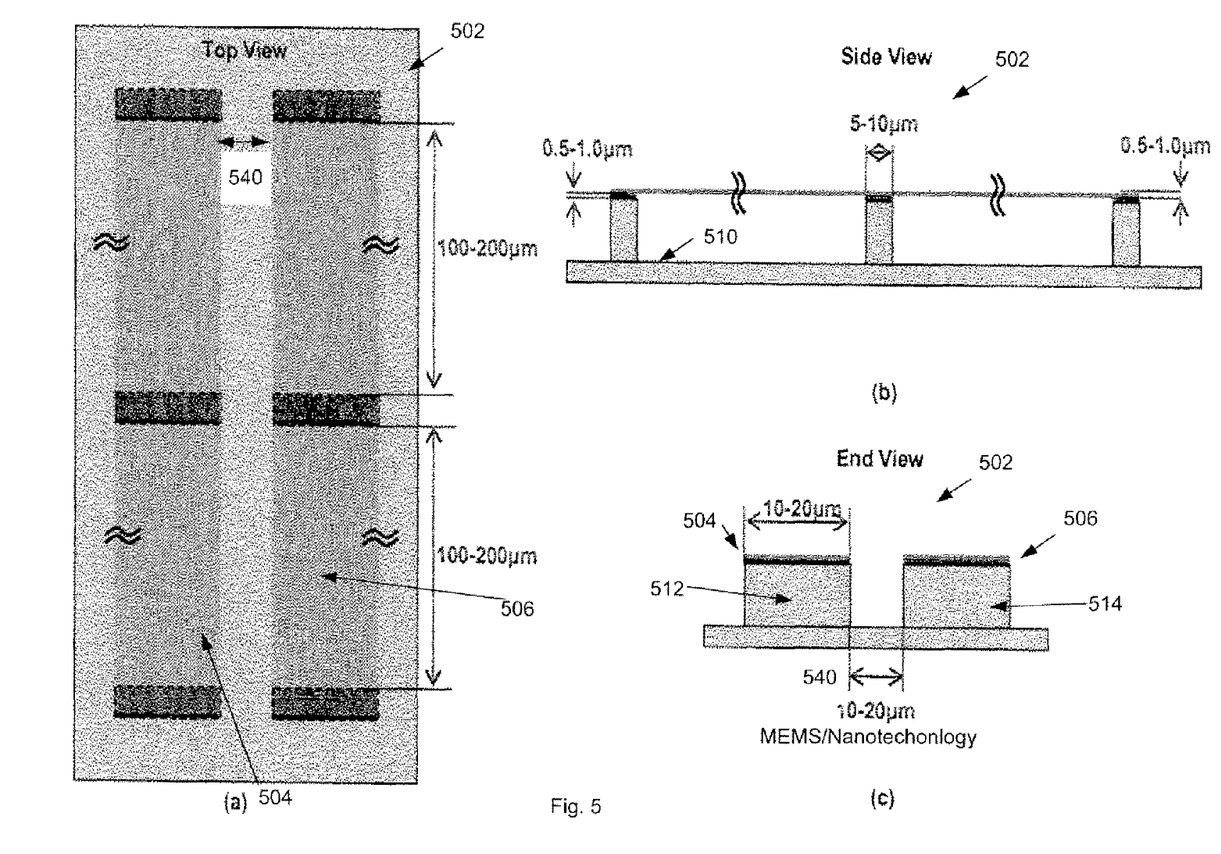
FIGS. 5a-c illustrate an embodiment of (a) a Top view of an electrode ion wind engine with the elevated electrodes; (b) a Side view of an electrode ion wind engine with the elevated electrodes; (c) an End view of an electrode ion wind engine with the elevated electrodes.
Figure 6:
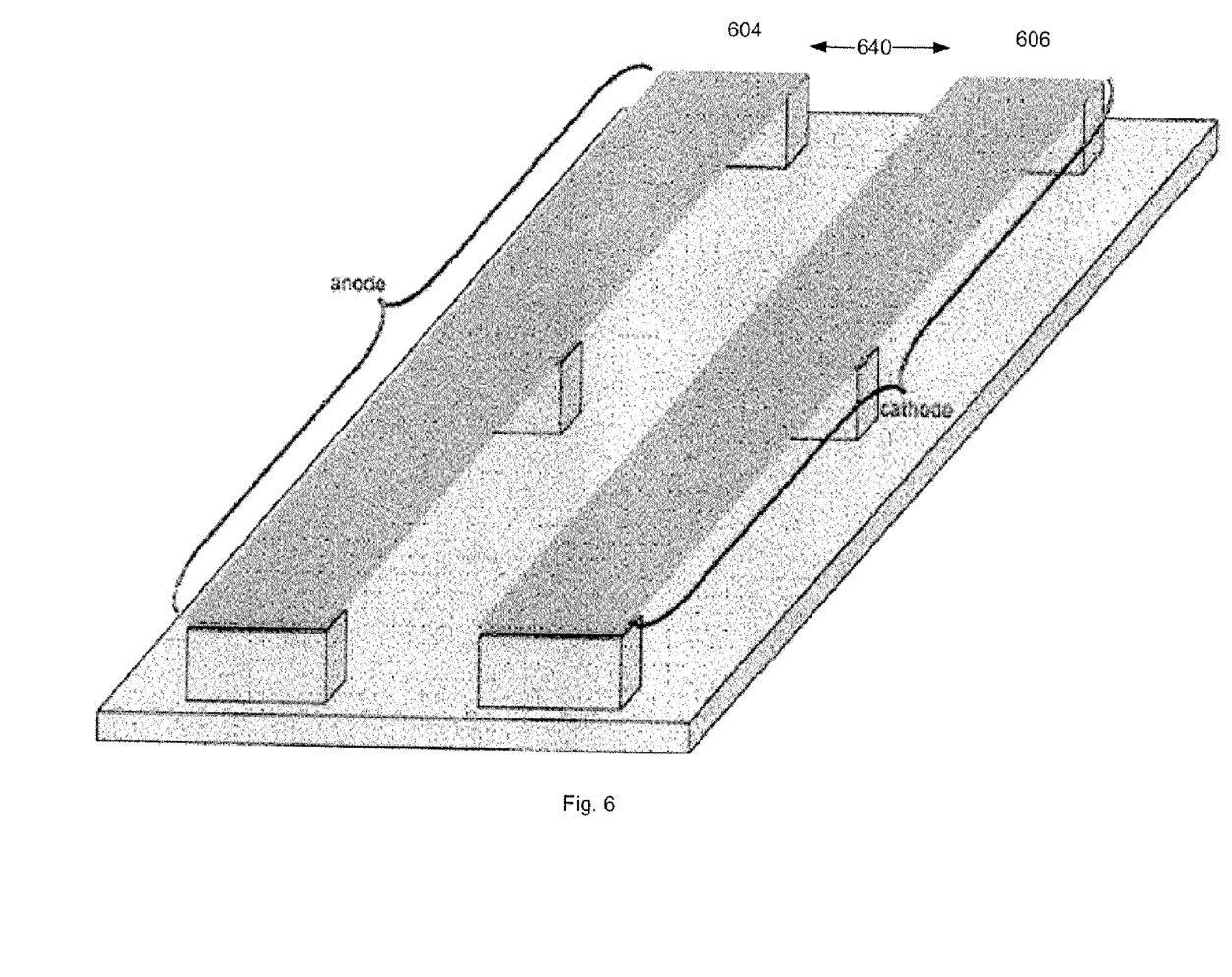
FIG. 6 illustrates an embodiment of an electrode ion wind engine with the elevated electrodes.

FIGS. 5a-c illustrate an embodiment of: (a) a Top view of an electrode ion wind engine with the elevated electrodes; (b) a Side view of an electrode ion wind engine with the elevated electrodes; and (c) an End view of an electrode ion wind engine with the elevated electrodes with the elevated electrodes. FIG. 6 illustrates an embodiment of an electrode ion wind engine with the elevated electrodes. The ionic wind generator 502 is formed when the first and the second bridge posts 512, 514 are etched out of the surface of the device 510 (such as a silicon wafer) and the first and the second electrodes 504, 506 are deposited on the bridge posts 512, 514. A layer of dielectric is either grown or deposited on the post and a sacrificial layer of material, such as photoresist, is deposited between the posts. The first and the second metal electrodes 504, 506 electrodes are deposited on the bridge posts and the sacrificial layer. Additionally, the bridge posts 512, 514 may be fabricated directly on the device 510 by either fabricating with a single layer of deposited metal, fabricating with a more than one layer of deposited metal, fabricating with a layer of deposited dielectric (such as a polymer or silicon dioxide) followed by one or more layers of deposited metal, and any combination thereof. The dielectric and metal deposition(s) also form the bridge electrodes 504, 506 and the sacrificial layer is used define the bridge post 512, 514 locations and to suspend the deposited metal layer. The sacrificial layer is then removed to generate bridge spans out of the dielectric/metal electrodes. Thus, in an embodiment, the sacrificial layer may be used to define the post locations, then the metal, multi-layered metal, or dielectric/metal electrodes are deposited to form the posts and electrodes, and then the sacrificial layer is then removed to generate bridge spans out of the electrodes. Each electrode is fabricated with MicroElectroMechanical System (MEMS) technology or Nanotechnology to make a gap 540 spacing between the first electrode and the second electrode less than twenty microns.

Note, the voltage level required to cause a generation of ions for the ionic wind generator is based on the distance of spacing between the first electrode and the second electrode. Elevated electrodes make micro scale ion winds a viable option for enhanced forced convection cooling of integrated circuit chips. Because micro scale ionic wind generators can be fabricated and integrated as an on-chip feature in microelectronics, an ionic wind generator offers an attractive cooling option as power dissipation requirements for hot-spot thermal management for portable electronic devices.

Referring to FIG. 6, the height (y) of the elevated electrodes 604, 606 and the gap (g) 640 between the two electrodes 604, 606 may be varied. Since the electrodes 604, 606 are elevated off the surface the orientation of the electrodes 604, 606 relative to the surface and each other may also be varied.

Examples of mobile computing devices may be a laptop computer, a cell phone, a personal digital assistant, or other similar device with on-board processing power and wireless communications ability that is powered by a Direct Current (DC) power source that supplies DC voltage to the mobile device and that is solely within the mobile computing device and needs to be recharged on a periodic basis, such as a fuel cell or a battery. As integrated circuitry scales down with technology advances, power dissipation requirements become more severe. The micro scale elevated-electrode ionic wind engine provides a chip-integrated method to enhance cooling of chip hot spots.

Figure 7:
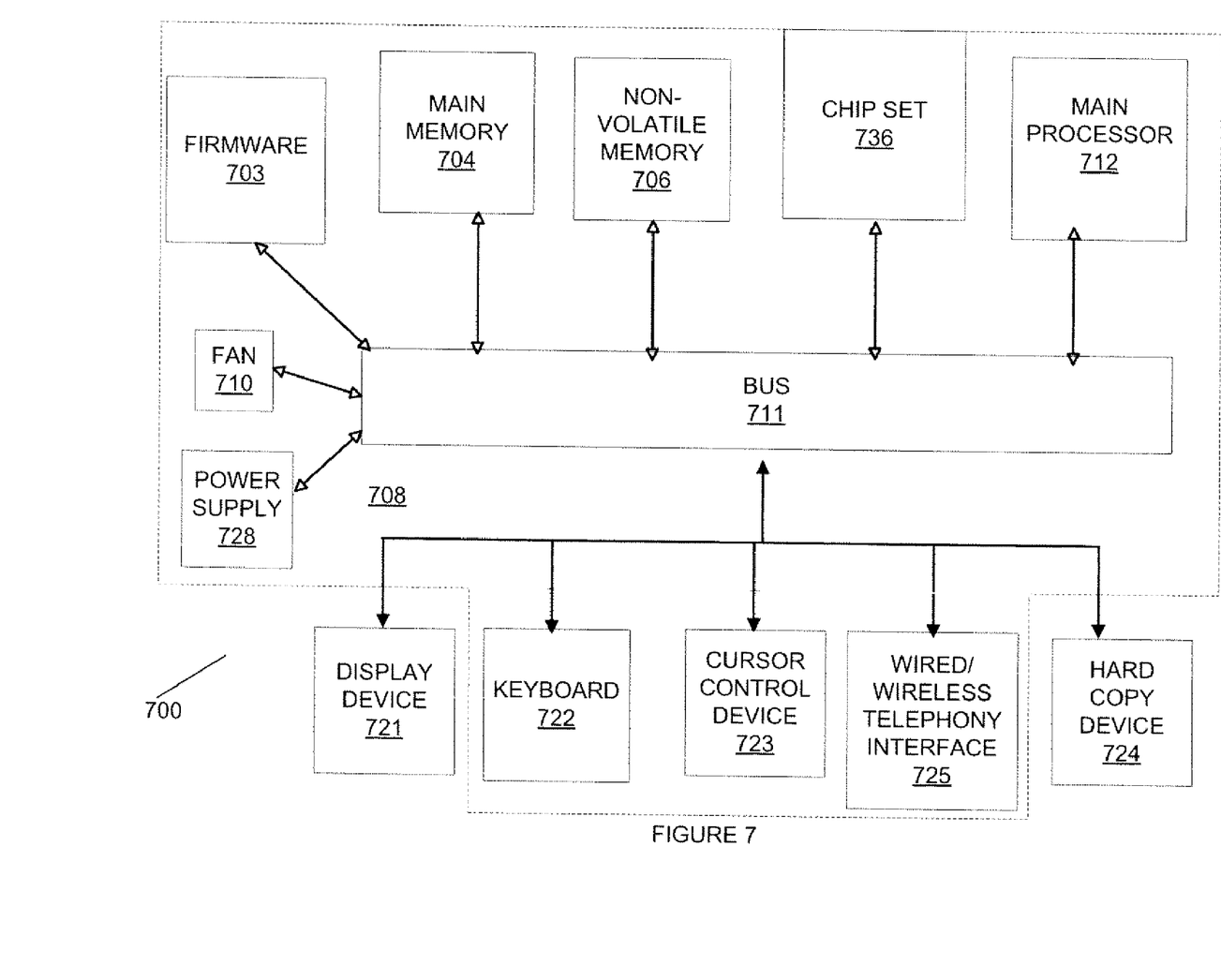

FIG. 7 illustrates a block diagram of an example computer system that may use an embodiment of an ionic wind generator. In one embodiment, computer system 700 comprises a communication mechanism or bus 711 for communicating information, and an integrated circuit component such as a main processing unit 712 coupled with bus 711 for processing information. One or more of the components or devices in the computer system 700 such as the main processing unit 712, a chip set 736, main memory 704, static storage device 706, or other hot components may use an embodiment of the ionic wind generator. The main processing unit 712 may consist of one or more processor cores working together as a unit.

Computer system 700 further comprises a random access memory (RAM) or other dynamic storage device 704 (referred to as main memory) coupled to bus 711 for storing information and instructions to be executed by main processing unit 712. Main memory 704 also may be used for storing temporary variables or other intermediate information during execution of instructions by main processing unit 712.

Firmware 703 may be a combination of software and hardware, such as Electronically Programmable Read-Only Memory (EPROM) that has the operations for the routine recorded on the EPROM. The firmware 703 may embed foundation code, basic input/output system code (BIOS), or other similar code. The firmware 703 may make it possible for the computer system 700 to boot itself.

Computer system 700 also comprises a read-only memory (ROM) and/or other static storage device 706 coupled to bus 711 for storing static information and instructions for main processing unit 712. The static storage device 706 may store OS level and application level software.

Computer system 700 may further be coupled to or have an integral display device 721, such as a cathode ray tube (CRT) or liquid crystal display (LCD), coupled to bus 711 for displaying information to a computer user. A chipset may interface with the display device 721. A housing may enclose at least the memories 704 and 706, the instruction processing components 712 736, the fan 710, and the one or more ionic wind generators.

An alphanumeric input device (keyboard) 722, including alphanumeric and other keys, may also be coupled to bus 711 for communicating information and command selections to main processing unit 712. An additional user input device is cursor control device 723, such as a mouse, trackball, trackpad, stylus, or cursor direction keys, coupled to bus 711 for communicating direction information and command selections to main processing unit 712, and for controlling cursor movement on a display device 721. A chipset may interface with the input output devices. Similarly, devices capable of making a hardcopy 724 of a file, such as a printer, scanner, copy machine, etc. may also interact with the input output chipset and bus 711.

Another device that may be coupled to bus 711 is a power supply such as a battery and Alternating Current adapter circuit. As discussed above, the DC power supply may be a battery, a fuel cell, or similar DC power source needs to be recharged on a periodic basis. Furthermore, a sound recording and playback device, such as a speaker and/or microphone (not shown) may optionally be coupled to bus 711 for audio interfacing with computer system 700. Another device that may be coupled to bus 711 is a wireless communication module 725. The wireless communication module 725 may employ a Wireless Application Protocol to establish a wireless communication channel. The wireless communication module 725 may implement a wireless networking standard such as Institute of Electrical and Electronics Engineers (IEEE) 802.11 standard, IEEE std. 802.11-1999, published by IEEE in 1999.

While some specific embodiments of the invention have been shown the invention is not to be limited to these embodiments. For example, the scalability of the ionic wind generator technology allows applications in notebook, desktop and server areas. An ionic wind generator may use electrode type components such as an ionizer, a charge repeller and a charge attractor in order to modify a cooling flow. There may be multiple corona electrodes to each collector electrode in an ionic wind generator and vice versa. The invention is to be understood as not limited by the specific embodiments described herein, but only by scope of the appended claims.

What is claimed is:

1. An apparatus, comprising:
    an ionic wind generator having a first electrode that is elevated off a surface of a device that the ionic wind generator is intended to cool, a first surface of the first electrode in contact with a first surface of a first post that elevates the first electrode off the surface of the device that the ionic wind generator is intended to cool; and
    a second electrode of the ionic wind generator, wherein the ionic wind generator to cause a generation of ions that are then drawn through an interstitial atmosphere from the first electrode to the second electrode to affect a velocity of local flow over the surface of the device between the first electrode and the second electrode, wherein flow from a forced flow device also affects the velocity of local flow over the surface of the device between the first electrode and the second electrode.

2. The apparatus of claim 1, wherein the first post is made of an insulating material, and a first surface of the second electrode is in contact with a first surface of a second post made of an insulating material that elevates the second electrode off the surface of device that the ionic wind generator is intended to cool.

3. The apparatus of claim 1, wherein the first electrode is fabricated with MicroElectroMechanical System (MEMS) technology to make a spacing between the first electrode and the second electrode less than twenty microns and a voltage level required to cause a generation of ions for the ionic wind generator is based on the distance of spacing between the first electrode and the second electrode.

4. The apparatus of claim 1, wherein the first electrode acts as a ion generating electrode and the second electrode acts a collector electrode and the electrodes relative height to each others and their geometric orientation may be arranged in a specific geometry to shape the velocity of local flow over the surface of the device.

5. The apparatus of claim 1, wherein a third electrode acts as a cathode and the first electrode acts as an anode and the second electrode acts as another cathode and the first, second and third electrodes are placed relative to the surface of the device, relative height to each other, and their geometric orientation arranged in a specific geometry to shape a velocity flow over the surface of the device.

6. The apparatus of claim 4, wherein a height of the first electrode relative to the surface is different than a height of second electrode relative to the surface in order to direct local flow towards or away from the surface.

7. The apparatus of claim 1, wherein the first electrode is on top of a first post having a first height dimension from the surface and the second electrode is on top of a second post having a second height dimension from the surface and a velocity gradient of the local flow over the surface of the device sharpens and increases the velocity closer to the surface when the first electrode is higher than the second electrode.

8. The apparatus of claim 1, wherein the first electrode is on top of a first post having a first height dimension from the surface and the second electrode is on top of a second post having a second height dimension from the surface and a velocity gradient of the local flow over the surface of the device the velocity profile of flow over the surface of the device bulges and increases further from the surface when the second electrode is higher than the first electrode.

9. The apparatus of claim 1, wherein the first electrode has a nanostructure forming one or more tips on a top surface of the first electrode to concentrate a strength of an electric field generated by the first electrode.

10. The apparatus of claim 9, wherein the nano-structure can consist of, but is not limited to, carbon nanotubes, nano crystalline diamonds, nano-filaments, nano-tips, nano-spheres, or nano-cylinders, or any combination thereof.

11. The apparatus of claim 2, wherein the first and the second posts were etched out of the surface of the device and the first and the second electrodes were deposited on the posts.

12. The apparatus of claim 11, wherein a layer of dielectric is grown or deposited on the first and the second posts and a sacrificial layer of material is deposited between the posts, the electrodes are then deposited on the posts and the sacrificial layer, and then the sacrificial layer is then removed to generate bridge spans out of the electrodes.

13. The apparatus of claim 2, wherein the first and the second posts were fabricated directly on the device by one of the following operations selected from the group consisting of a fabricating with a single layer of deposited metal, fabricating with a more than one layer of deposited metal, fabricating with a layer of deposited dielectric followed by one or more layers of deposited metal, and any combination thereof.

14. A system, comprising:
a memory;
an instruction-processing component;
a fan to provide flow to cool the memory and instruction-processing component;
one or more ionic wind generators on the memory, where each ionic wind generator has a first electrode that is elevated off a surface of the memory that the ionic wind generator is intended to cool, a first surface of the first electrode in contact with a first surface of a first post that elevates the first electrode off the surface of the memory that the ionic wind generator is intended to cool and has a second electrode of the ionic wind generator, wherein each ionic wind generator to cause a generation of ions that are then drawn through an interstitial atmosphere from the first electrode to the second electrode to affect a velocity of local flow over the surface of the memory between the first electrode and the second electrode; and
a DC power supply to supply power for the memory, the instruction processing component, the fan, and the one or more ionic wind generators.

15. The system of claim 14, wherein a first surface of the second electrode is in contact with a first surface of a second post that elevates the second electrode off the surface of device that the ionic wind generator is intended to cool.

16. The system of claim 15, wherein the first electrode is fabricated with MicroElectroMechanical System (MEMS) technology to make a spacing between the first electrode and the second electrode less than twenty microns and a voltage level required to cause a generation of ions for the ionic wind generator is based on the distance of spacing between the first electrode and the second electrode.

17. The system of claim 15, wherein a third electrode acts as a cathode and the first electrode acts as an anode and the second electrode acts as another cathode and the first, second and third electrodes are placed relative to the surface of the device, relative height to each other, and their geometric orientation arranged in a specific geometry to shape a velocity flow over the surface of the device and the first electrode has a nanostructure forming one or more tips on a top surface of the first electrode to concentrate a strength of an electric field generated by the first electrode, which lowers a voltage level required to cause the generation of ions drawn through the interstitial atmosphere from the first electrode to the second electrode.

18. A method, comprising:
etching a first and a second posts of an ionic wind generator out of a surface of a device that the ionic wind generator is intended to cool, wherein the first and second posts elevate to a given height off the surface of the device;
depositing a first electrode of the ionic wind generator on the first post;
depositing a second electrode of the ionic wind generator on the second post; and
arranging in a specific geometry a relative height of each electrode to each other and the electrodes' geographic orientation to each other in order to shape local flow across the surface of the device, wherein an ionic wind between the electrodes augments a flow from a forced flow device to shape a velocity of local flow over the surface of the device between the first electrode and the second electrode.

19. The method of claim 18, further comprising:
one of growing or depositing a layer of dielectric on the first and the second posts;
depositing a sacrificial layer of material between the posts;
depositing the electrodes on the posts and the sacrificial layer; and
removing the sacrificial layer.

20. The method of claim 18, further comprising:
one of growing or depositing one or more nanostructures to form one or more tips on a top surface of the first electrode.

* * * * *

UNITED STATES PATENT AND TRADEMARK OFFICE
CERTIFICATE OF CORRECTION

| | | |
|---|---|---|
| PATENT NO. | : 7,545,640 B2 | Page 1 of 1 |
| APPLICATION NO. | : 11/676194 | |
| DATED | : June 9, 2009 | |
| INVENTOR(S) | : Fisher et al. | |

It is certified that error appears in the above-identified patent and that said Letters Patent is hereby corrected as shown below:

On the title page, item (73): delete "Intel Corporation, Santa Clara, CA (US)" and insert --Purdue Research Foundation, West Lafayette, IN (US)--.

Signed and Sealed this

Twenty-seventh Day of October, 2009

David J. Kappos
*Director of the United States Patent and Trademark Office*